United States Patent [19]

Larson

[11] Patent Number: 4,633,228

[45] Date of Patent: Dec. 30, 1986

[54] ENTRY ERROR ELIMINATION FOR DATA SYSTEMS

[75] Inventor: Willis A. Larson, North Andover, Mass.

[73] Assignee: AMP Incorporated, Harrisburg, Pa.

[21] Appl. No.: 606,428

[22] Filed: May 2, 1984

[51] Int. Cl.$^4$ ............................ H04Q 4/00; G06F 3/02
[52] U.S. Cl. ............................ 340/365 E; 340/365 R; 340/365 S
[58] Field of Search ............ 340/365 E, 365 S, 365 R

[56] References Cited

U.S. PATENT DOCUMENTS 3,576,569  4/1971  Watson .......................... 340/365 E Primary Examiner—James L. Rowland
Assistant Examiner—T. Rittmaster
Attorney, Agent, or Firm—Frederick W. Raring

[57] ABSTRACT

Switch assembly, such as a keyboard switch assembly, comprises a plurality of polled conductors, a plurality of scanned conductors, and switch sites, each of which has an associated scanned conductor and polled conductor adjacent thereto. When a switch at each switch site is closed, the associated polled conductor is connected to the associated scanned conductor and closure of the switch is determined by a polling and scanning means. Each switch has a switch resistor in series therewith and each scanned conductor has a scanned conductor resistor between the scanned conductor and one side of the power supply. The analyzer associated with the switch assembly has the ability to determine whether a signal indicating that a particular switch is closed is a true signal caused by actual closure of the signal or alternatively is a phantom signal caused by the closure of a group of switches in the switch matrix. The determination is made on the basis of the difference in voltage detected when a true switch closure is made and when a phantom switch closure is indicated.

4 Claims, 6 Drawing Figures

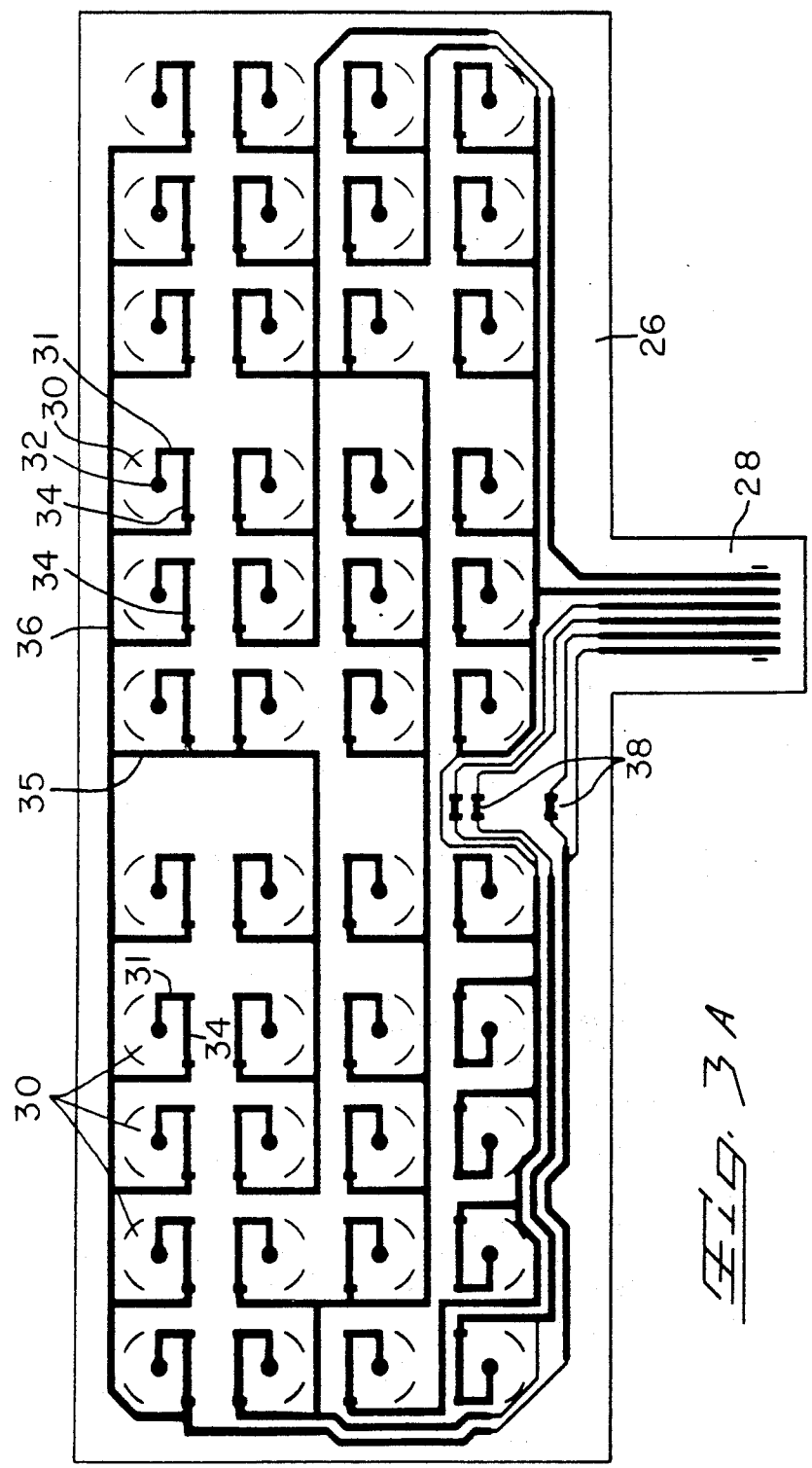

ENTRY ERROR ELIMINATION FOR DATA SYSTEMS

ENTRY ERROR ELIMINATION FOR DATA SYSTEMS

1. Field of the Invention

This invention relates to switch assemblies of the type used for data entry systems and particularly to an improved switch assembly which has entry error elimination features. The invention is herein described as a keyboard switch assembly however, it will be apparent that the principles of the invention can be used under circumstances other than in keyboards.

2. Background of the Invention

A commonly used type of keyboard switch assembly comprises a plurality of polled conductors which are connected to a polling means, a plurality of scanned conductors which are connected to a scanner, and a plurality of switch sites, each switch site having an associated polled conductor and an associated scan conductor adjacent thereto. A switch is provided at each switch site to connect the associated polled conductor to the associated scanned conductor and a detector or analyzer is provided to detect the closure of a particular switch. When a particular switch is closed by the keyboard operator, the associated scanned conductor is scanned by a scanning means, and it is apparent to the detector that the particular switch in question is actually closed.

A problem with keyboard switch assemblies of the type described above is that under certain circumstances "phantom" closures are detected as a result of the fact that a group of switches are closed by the keyboard operator and the closure of the group of switches permits a signal to pass along the associated polled conductor of the phantom key through the switches of the group to the associated scanned conductor. In other words, the signal passes by a circuitous route through the polled conductor to the scanned conductor and not through the switch, which is actually open. This phantom key phenomenon is caused when a keyboard operator holds several keys in a depressed condition simultaneously, and is extremely troublesome to the manufacturers of word processors, computers, and other devices which use keyboards. A number of systems are available for minimizing or eliminating the phantom key effects however, most of them require additional circuitry or circuit components and tend to add greatly to the overall expense of the system. For example, phantom key effects can be prevented by providing a diode for each switch but this solution to the problem involves a significant increase in the cost of manufacturing.

The present invention is directed to an improved switch assembly which substantially eliminates phantom key effects without the use of circuit devices other than the addition of resistors to the scanned conductors and to the switches of the switch assembly. The invention is particularly advantageous where the switches are produced on flexible membranes by the commonly known silk screening techniques.

THE INVENTION

A switch assembly in accordance with the invention is of the type comprising a power supply, a polling means, a scanner, a plurality of polled conductors which are connected to the polling means, and a plurality of scanned conductors which are connected to the scanner. A plurality of switch sites are provided, each switch site having an associated polled conductor and an associated scanned conductor adjacent thereto. A switch is provided at each switch site to connect the associated polled conductor to the associated scanned conductor. Each switch has first and second conditions, one of the conditions being closed and the other condition being opened. An analyzer is associated with the system which determines the condition of each switch during scanning. The switch assembly is characterized in that each switch has a switch resistor in series therewith and each scanned conductor has a scanned conductor resistor between the scanned conductor and one side of the power supply. The analyzer has the ability to determine, when a signal is received indicating that a predetermined switch is in the first condition, whether the signal is a true signal which passed through the predetermined switch and is effected by the switch resistor of the predetermined switch and scanned conductor resistors of the associated scanned conductor of the predetermined switch or alternatively the signal is a false signal which passed through a group of other switches which are in the first condition at the instant of scanning and the false signal is affected by the switch resistors of the group of other switches. In one embodiment, the first condition of the switches is the closed condition.

In accordance with further embodiments, the switch assembly comprises a substrate and a flexible membrane which extends parallel to, and is spaced from, the substrate. The membrane and the substrate have opposed surfaces on which the polled conductors, the scanned conductors, the switches, the switch resistors, and the scanned conductor resistors are provided. The conductors and the resistors on these opposed surfaces are, in one embodiment, of conductive ink.

THE DRAWING FIGURES

FIG. 3A is a view showing the circuit paths of a group of scanned conductors as applied on the surface of a flexible film by silk screening operations, the conductors and the resistors shown in FIG. 3A being of conductive ink.

FIGS. 4A and 4B can be placed beside each other along the lines X—X to show the entire diagram.

THE DISCLOSED EMBODIMENT

In the description which follows, a typical keyboard switch assembly as presently known will first be described with reference to FIG. 2 and the phantom key phenomenon will be described with reference to FIG. 2. Thereafter, the present invention will be described with reference to FIGS. 1, 3A and 3B.

Figure 2:
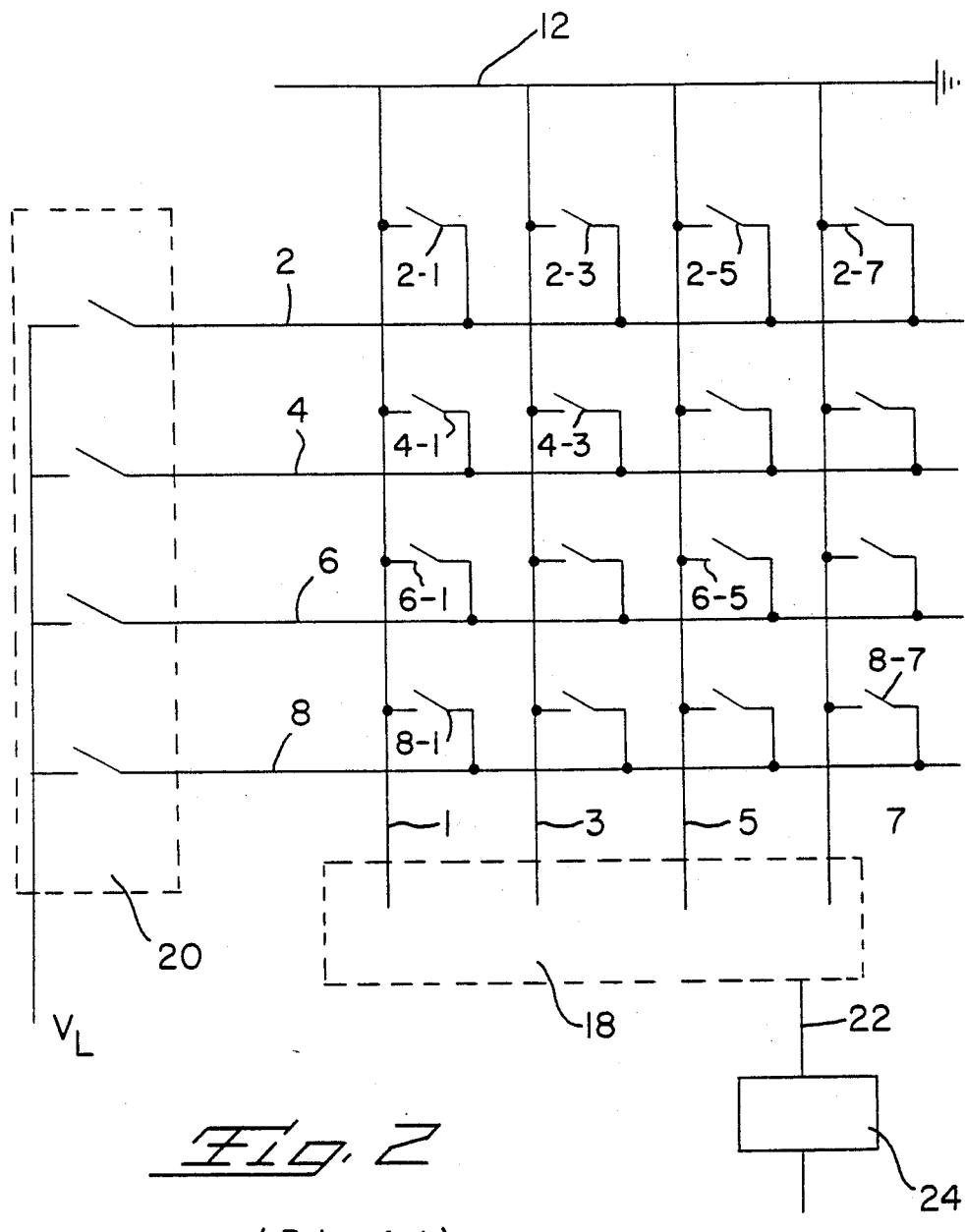
FIG. 2 is a view similar to FIG. 1 but showing the same circuit with the novel features of the invention eliminated therefrom, in other words showing a prior art switch assembly.

FIG. 2 shows a switch assembly comprising polled conductors 2, 4, 6, and 8, and scanned conductors 1, 3,

5, and 7. A plurality of switch sites are defined by the intersections or crossing locations of the polled and scanned conductors and each switch site is identified by the associated polled conductors and the associated scanned conductor. Thus, the switch which, when closed, connects conductor 2 to conductor 1 is identified as switch 2-1 and the switch which, when closed, connects conductor 8 to conductor 7 is identified as 8-7. The scanned conductors 1, 3, 5, 7 are connected to a ground conductor 12 which is one side of the power supply and the polled conductors are connected to the polling means 20 and to the other side of the power supply ($V_L$). The scanned conductors are also connected to the scanner 18 and by conducting lines 22 to a detector or analyzer 24 from which the output signal is transmitted.

During normal operation of the switch assembly of FIG. 2, a single switch will be closed by the operator and prior to the closure of another switch, the first switch will be opened. For example, if the switch 4-1 is closed, a signal will pass through conductor 4, through switch 4-1 to conductor 1 and then to the conductor 12. The fact of the closure of switch 4-1 will be determined when conductor 1 is scanned while conductor 4 is being polled. During the same scanning cycle, the other scanned conductors will not indicate any switch closures since the switches will all be opened and no signal will pass through these other scanned conductors.

A phantom switch closure of switch 4-1 can take place if the operator closes simultaneously switches 2-1, 2-3 and 4-3. If these three switches are held in a closed condition, a signal can pass from the voltage source through conductor 4 to and through switch 4-3 to conductor 3. The signal will then pass through switch 2-3 to conductor 2 to switch 2-1 to conductor 1 and then to conductor 12. Under these circumstances, when conductor 1 is scanned while conductor 4 is being polled, the scanner will indicate that indeed a signal is passing from conductor 4 to conductor 12 even though switch 4-1 is in fact open. These phantom closures are thus extremely troublesome and manufacturers of keyboards have gone to great lengths to minimize their effect or eliminate them.

Figure 1:
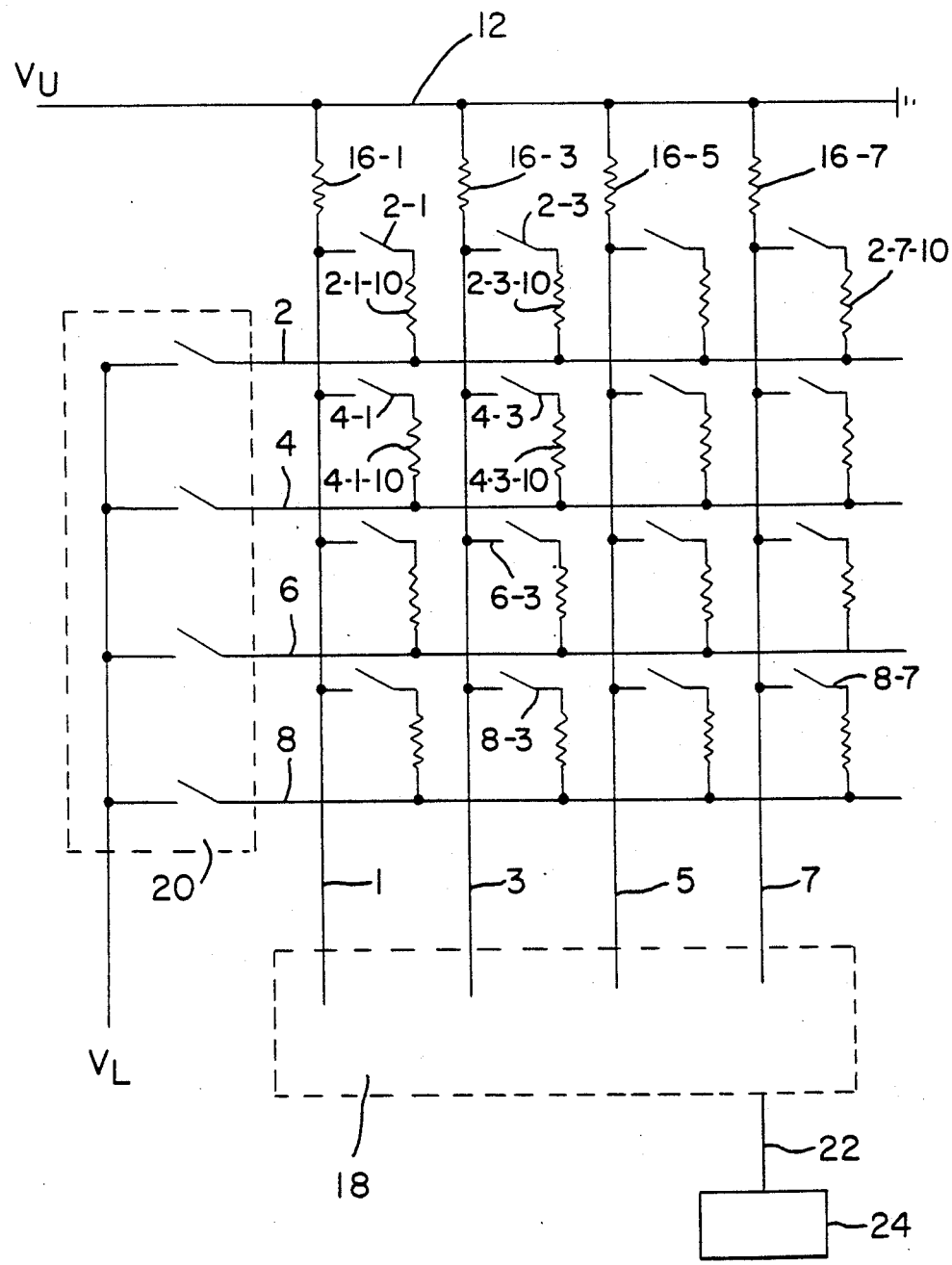
FIG. 1 is a simplified diagrammatic circuit showing a switch assembly in accordance with the invention.

FIG. 1 shows diagrammatically the principles of the present invention as applied to the circuit diagram of FIG. 2 and the principles of the invention can be explained fully with reference to FIG. 1.

In accordance with the invention, each of the switches 2-1, 2-3, etc. has in series therewith a switch resistor as generally indicated at 10 and as specifically indicated for each switch site by the switch number followed by the reference numeral 10. Thus the switch resistor for switch 4-1 is 4-1-10. It will be apparent from FIG. 1 that each switch resistor is dedicated to its associated switch and the switch resistors are not shared by a group of switches. In other words, each individual switch has a dedicated individual switch resistor.

In addition to the switch resistors, scanned conductor resistors 16-1, 16-3, 16-5, and 16-7 are provided between the scanned conductors and one side of the power supply 12, the side being the ground side in FIG. 1. The embodiment of FIG. 1 has in other respects the same elements as the previously described embodiment of FIG. 2, the scanned conductors being connected to a scanner 18 and the polled conductors being connected to a polling means 20.

In normal operation, the embodiment of FIG. 1 operates in the same manner as the embodiment of FIG. 2; when the switch 4-1 is truly closed, a signal passes through conductor 4, through resistor 4-1-10, through switch 4-1 to conductor 1, and then through resistor 16-1 to ground or earth conductor 12.

If switches 2-1, 2-3 and 4-3 are held in a closed condition, a signal will again pass through conductor 4, through switch 4-3 to conductor 3, through switch 2-3 to conductor 2, and then through switch 2-1 to conductors 1 and 12. However, the signal will be profoundly effected by the fact that it was required to pass through resistors 4-3-10, 2-3-10, and 2-1-10, prior to arriving at conductor 1. It will be apparent then that a significant voltage drop wil take place as a result of the passage through these three resistors and the detector will readily be able to determine that the voltage has been profoundly effected by this circuitous path and added resistance and the signal is not a true signal which passed directly through switch 4-1 and passed only through resistor 4-1-10 and resistor 16-1.

The presence of the scanned conductor resistors 16-1, 16-3, 16-5, and 16-7 is desirable in the practice of the invention in order to emphasize the differences between the voltage observed by the scanner when a true closure of a switch is encountered and the voltage observed when a false closure is encountered. The actual determination of whether a switch closure is a true closure or a phantom closure depends upon the difference in the voltages of the two observations.

The switch resistors and the polled conductor resistors indicated in FIG. 1 can be provided in any type of circuit as regards the manufacture of the circuit however, the invention is particularly advantageous when used in membrane-type circuits since the resistors and the conductors can both be provided on the surface of the membrane or the substrate of the switch assembly by printing techniques such as silk screening or vacuum deposition.

Figure 3B:
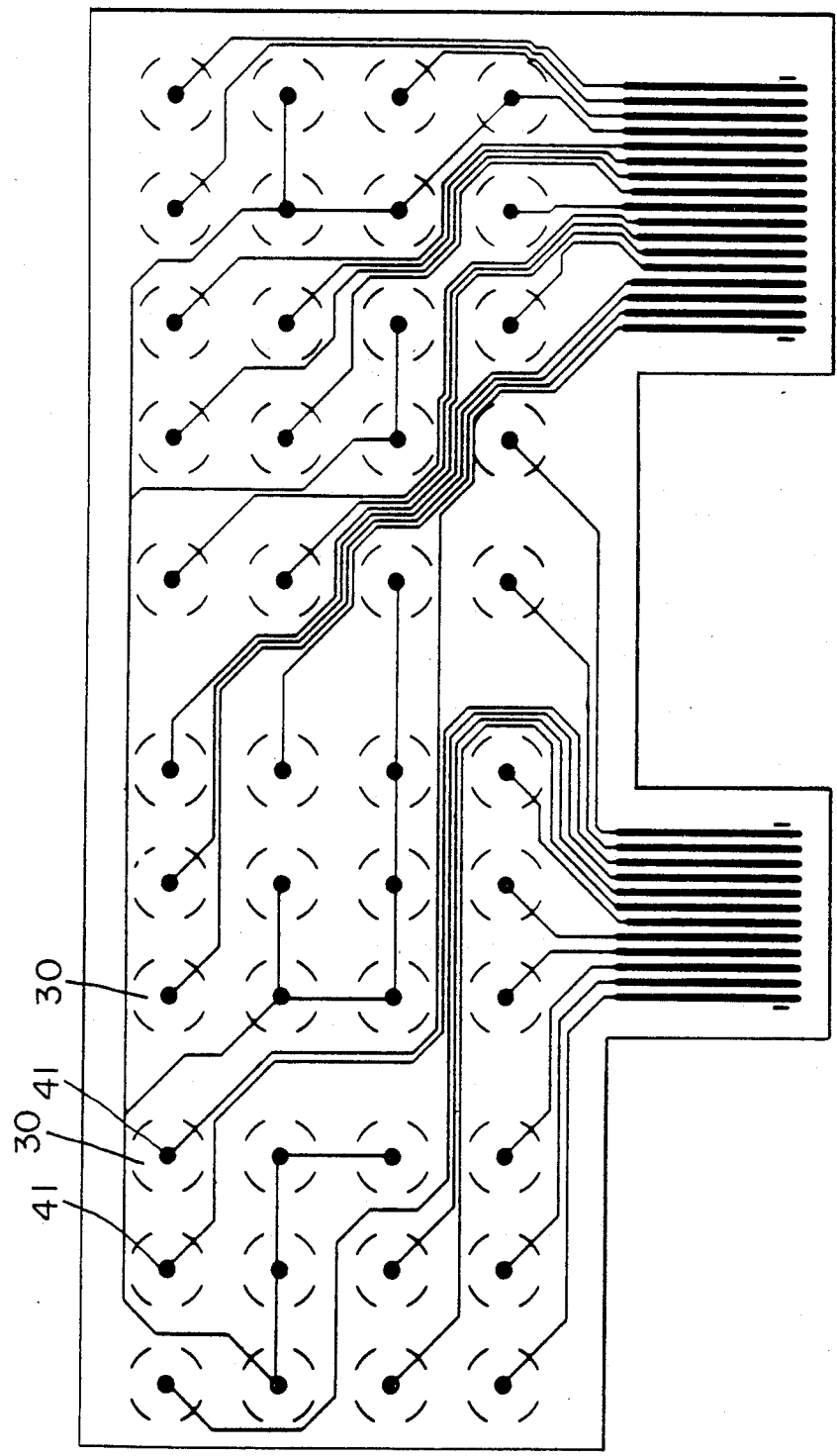
FIG. 3B is a view similar to FIG. 3A but showing the circuit paths for the polled conductors.
Figure 4A:
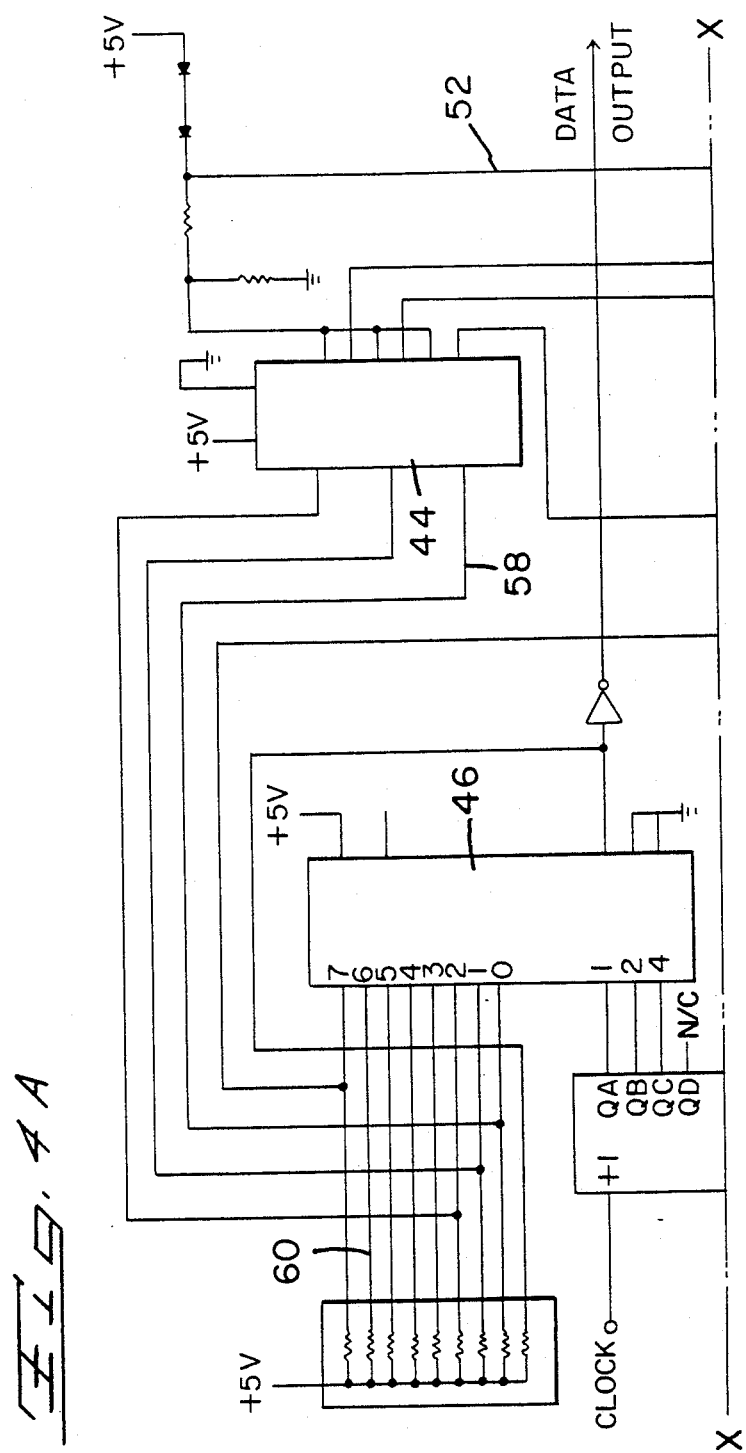
FIGS. 4A and 4B are a schematic diagram of typical circuitry for a keyboard switch assembly in accordance with the invention; this view shows schematically the scanned conductors shown in FIGS. 3A and 3B.
Figure 4B:
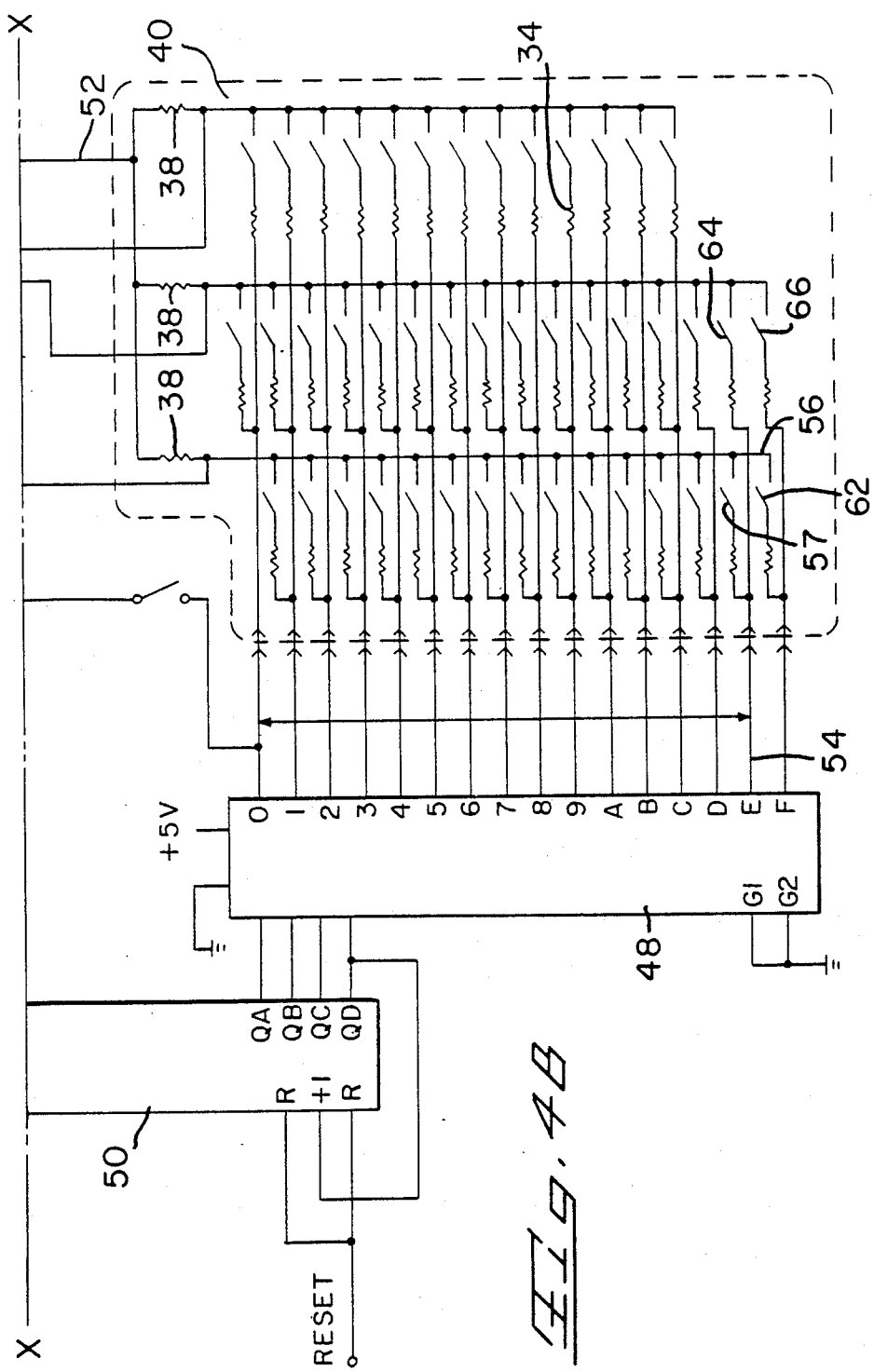

FIGS. 3A and 3B are reproductions of a actual circuits which form part of the assembly of FIG. 4. The circuit of FIG. 3A comprises an insulating film 26 of polyester or similar material having an integral tail 28 onto which the conductors extend. A plurality of switch sites are shown at 30 and each switch site has a switch contact or electrode 32. A conductor 31 extends from the electrode to the associated switch resistor 34 and a further conductor 35 extends from the resistor to the associated scanned conductor 36 which extends through one of the scanned conductor resistors 38 to the tail 28. In the manufacture of the circuit of FIG. 3A, the conductors 31, 35, 36, and the switch electrodes 32 would be of a conductive ink having a relatively high conductivity, for example, a silver bearing ink and all of these conductors would be provided on the surface of the film 26 by a silk screening pass. Thereafter, the resistors 36 and 38 could be formed by a second silk screening pass using an ink which is much less conductive than the silver bearing ink of the conductors 31, 35, 36, and the switch electrodes 32. It will be apparent then that protection against phantom key effects can be provided by the simple expedient of adding one silk screening pass to the manufacturing process and adding a detection means, such as a comparator, to the circuit.

FIG. 3B shows a comparison circuit which would be opposed to the circuit of FIG. 3A and separated therefrom by a suitable spacer. The circuit of FIG. 3B has two tails as shown and has switch contacts as shown at 41 which are opposed to the contacts 32. The conductors extend as shown to the tails.

FIG. 4 is a schematic diagram for a keyboard switch assembly showing the essential associated circuit devices which collectively would make up the scanner, the polling means, and the detector described with reference to FIG. 1. The switches are contained within the area outlined by the broken line and indicated at 40. This area in actuality would be comprised of the circuit shown in FIGS. 3A and 3B. The assembly in FIG. 4 includes a detector 44 which is a quad voltage comparator, LM 339, available from National Semiconductor; the scanner, 46 which is an 8-input multiplexer, N74151N is available from Signetics; the polling means 48, is a 1- of 16 decoder/demultiplexer, N74159N available from signetics; and a dual 4-bit binary ripple counter, 50 which is a N74393N available from Signetics. The pull-up (scanned) resistors, 38, are connected two diode voltage drops below the 5-volt DC voltage source by conductor 52. Resistors 38 are chosen to be about 1,000 ohms. The switch resistors, 34 are chosen to be about 10,000 ohms. Calculation and experimentation indicates that the reference voltage of the comparators, 44 should be set at about 93 percent of the voltage on wire 52, when the ratio of the switch resistors 34 to the pull-up resistors 38 is about ten to one.

In operation, the binary ripple counter 50, provides the necessary timing signals to the polling means 48 and the scanning means 46. Each output of the polling means 48 is turned on in sequence, zero through F, one line at a time. For instance, when the count is right, line 54 extending from the polling means 48 will be on. The open collector NPN transistor output of this circuit pulls the conductor 54 to a voltage very near the ground side of the power supply. If switch 57 is closed at that instant, then the voltage on conductor 56 will fall from being approximately equal to that on conductor 52 to about 90 percent of that on conductor 52 due to the voltage divider action of the switch resistor associated with switch 57 and the pull-up resistor 38 associated with the conductor 56. The voltage on conductor 56 is detected by the comparator 44 and since it is less than 93 percent, the comparator output on conductor 58 changes state. The scanner 46 reads the output of the comparators 44 and then provides an output to conductor 60 which is used as an output signal by other circuitry not shown. The count, as represented by counter 50, tells the other circuitry not shown which switch was closed, as there is a unique switch for each polled line and scanned line.

Now, if instead of switch 57 being closed, switches 62, 64 and 66 are closed, then, when conductor 54 is polled, the current must flow through the three resistors associated with switches 62, 64 and 66 instead of just one resistor. This changes the ratio of the switch resistors to the pull-up resistor 38 which causes the voltage on conductor 56 to be about 99.6 percent of the voltage on conductor 52 and therefore the comparator does not switch when conductor 58 is scanned by scanner 46. The phantom switch closure at switch 57 has been ignored by the circuitry. Calculations and experimentation has shown that if the switch resistors 34 and the pull-up resistors 38 are held to a plus or minus 20 percent tolerance and the ratio of these resistors is about ten to one, then any ten switches on the keyboard can be closed without a phantom switch problem.

I claim:

1. A keyboard switch assembly of the type comprising a power supply, a polling means, a scanner, a plurality of polled conductors which are connected to the polling means, a plurality of scanned conductors which are connected to the scanner, and a plurality of switch sites, each switch site having an associated polled conductor and an associated scanned conductor adjacent thereto, an individual switch at each switch site for connecting the associated polled conductor to the associated scanned conductor, each switch having first and second conditions, one of the conditions being closed and the other condition being open, and an analyzer which determines the condition of each switch during polling scanning, the switch assembly being characterized in that:

each individual switch has a dedicated individual switch resistor in series therewith and each scanned conductor has a scanned conductor resistor between the scanned conductor and one side of the power supply, the analyzer has the ability to determine, when a signal is received indicating that a predetermined individual switch is in the first condition, whether the signal is a true signal which passed through the predetermined individual switch and is effected by the dedicated individual switch resistor of the predetermined individual switch and scanned conductor resistor of the associated scanned conductor of the predetermined individual switch or alternatively the signal is a false signal which passed through a group of other individual switches which are in the first condition at the instant of scanning and the false signal is effected by the dedicated individual switch resistors of the group of other individual switches the switch assembly comprising a substrate and a flexible membrane which extends parallel to, and is spaced from the substrate, the flexible membrane and the substrate having opposed surfaces on which the polled conductors, the scanned conductors, the individual switches, the dedicated individual switch resistors, and the scanned conductor resistors are provided, the scanned conductors, the polled conductors, the individual switches, the dedicated individual switch resistors, and the scanned conductor resistors are of conductive ink.

2. A keyboard switch assembly as set forth in claim 1 characterized in that the first condition of the switches is the closed condition.

3. A keyboard switch assembly as set forth in claim 1 characterized in that the switch resistors and the scanned conductor resistors are of a conductive ink having a relatively low conductivity, the scanned conductors and the polled conductors being of a conductive ink having a relatively high conductivity.

4. A keyboard switch assembly as set forth in claim 2 characterized in that the analyzer has the ability to determine the condition of each switch from voltage determination.

* * * * *